(12) United States Patent
Lin et al.

(10) Patent No.: US 10,957,545 B2
(45) Date of Patent: Mar. 23, 2021

(54) METHOD FOR MANUFACTURING SEMICONDUCTOR DEVICE (71) Applicant: TAIWAN SEMICONDUCTOR MANUFACTURING CO., LTD., Hsinchu (TW)

(72) Inventors: Jia-Ming Lin, Tainan (TW); Shiu-Ko Jangjian, Tainan (TW); Chun-Che Lin, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/206,788

(22) Filed: Nov. 30, 2018

(65) Prior Publication Data
US 2019/0115220 A1 Apr. 18, 2019

Related U.S. Application Data (62) Division of application No. 14/754,427, filed on Jun. 29, 2015, now Pat. No. 10,861,701.

(51) Int. Cl.
H01L 21/285 (2006.01)
H01L 21/28 (2006.01)
H01L 21/768 (2006.01)
H01L 29/66 (2006.01)
H01L 29/49 (2006.01)
H01L 29/51 (2006.01)

(52) U.S. Cl.
CPC .. H01L 21/28568 (2013.01); H01L 21/28088 (2013.01); H01L 21/76843 (2013.01); H01L 21/76879 (2013.01); H01L 29/4966 (2013.01); H01L 29/66545 (2013.01); H01L 29/513 (2013.01); H01L 29/517 (2013.01)

(58) Field of Classification Search
CPC ......... H01L 21/28568; H01L 21/28088; H01L 21/76843; H01L 21/76879
See application file for complete search history.

(56) References Cited

U.S. PATENT DOCUMENTS

| | | | |
|---|---|---|---|
| 6,184,113 B1 | 2/2001 | Seo et al. | |
| 6,284,636 B1 | 9/2001 | Hossain et al. | |
| 6,326,297 B1 | 12/2001 | Vijayendran | |
| 7,126,199 B2 | 10/2006 | Doczy et al. | |
| 9,012,319 B1* | 4/2015 | Choi .................. | H01L 21/28158 438/591 |

(Continued)

FOREIGN PATENT DOCUMENTS

| | | |
|---|---|---|
| DE | 112012003020 T5 | 5/2014 |
| KR | 2000-0003477 A | 1/2000 |

(Continued)

Primary Examiner — Peniel M Gumedzoe
(74) Attorney, Agent, or Firm — Maschoff Brennan (57) ABSTRACT A method includes etching a dummy gate to form an opening. A gate dielectric layer is deposited in the opening. A blocking layer is deposited over the gate dielectric layer, wherein the blocking layer has a bottom portion over a bottom of the opening and a sidewall portion over a sidewall of the opening. An adhesive layer is deposited over the bottom portion of the blocking layer. A metal layer is deposited over the adhesive layer, wherein the metal layer is in contact with the sidewall portion of the blocking layer.

20 Claims, 6 Drawing Sheets (56) References Cited

U.S. PATENT DOCUMENTS

| | | | |
|---|---|---|---|
| 2006/0065939 A1* | 3/2006 | Doczy | H01L 21/823437 257/412 |
| 2007/0281456 A1 | 12/2007 | Kim et al. | |
| 2009/0004848 A1 | 1/2009 | Kim et al. | |
| 2013/0020658 A1* | 1/2013 | Guo | H01L 29/4958 257/412 |
| 2013/0026578 A1 | 1/2013 | Tsau | |
| 2013/0181264 A1 | 7/2013 | Liao et al. | |
| 2013/0280900 A1 | 10/2013 | Lai et al. | |
| 2014/0131809 A1 | 5/2014 | Ando et al. | |
| 2014/0154877 A1 | 6/2014 | Besser et al. | |
| 2015/0171179 A1* | 6/2015 | Horii | H01L 29/4966 257/761 |
| 2015/0187763 A1* | 7/2015 | Kim | H01L 27/088 257/392 |
| 2015/0318204 A1 | 11/2015 | Lee et al. | |

FOREIGN PATENT DOCUMENTS

| | | |
|---|---|---|
| KR | 10-2001-0096408 A | 11/2001 |
| KR | 10-2007-0046201 A | 5/2007 |
| KR | 10-2013-0014299 A | 2/2013 |
| TW | 386298 B | 4/2000 |
| WO | 01/78123 A1 | 10/2001 |

\* cited by examiner

METHOD FOR MANUFACTURING SEMICONDUCTOR DEVICE

CROSS REFERENCE TO RELATED APPLICATION

The present application is a Divisional Application of the U.S. application Ser. No. 14/754,427, filed Jun. 29, 2015, which is herein incorporated by reference.

BACKGROUND

The continuous effort to improve semiconductor device performance brings with it a continuous effort of scaling down device feature sizes thereby improving the device performance speed and its functional capability. In the course of semiconductor integrated circuit (IC) evolution, functional density (i.e., the number of interconnected devices per chip area) has generally increased while geometry size (i.e., the smallest component (or line) that can be created using a fabrication process) has decreased. Such scaling down has also increased the complexity of IC processing and manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
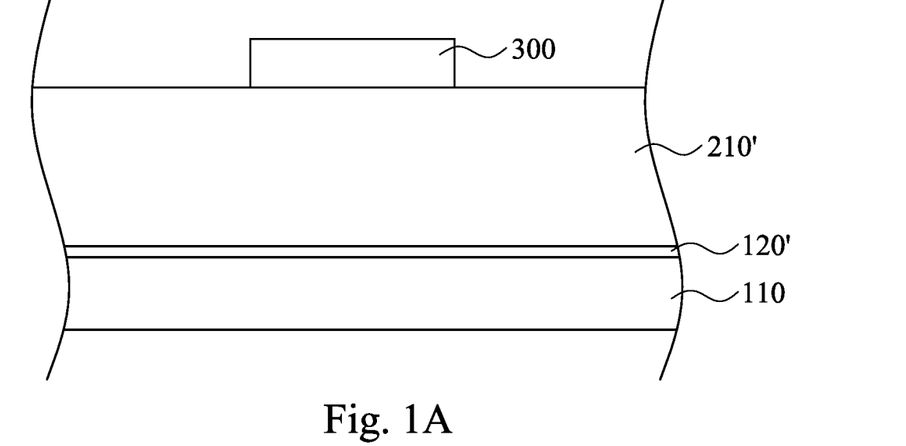
FIGS. 1A to 1G are cross-sectional views of a method for manufacturing a semiconductor device at various stages in accordance with some embodiments of the present disclosure.

FIGS. 1A to 1G are cross-sectional views of a method for manufacturing a semiconductor device at various stages in accordance with some embodiments of the present disclosure. Reference is made to FIG. 1A. A substrate 110 is provided. The substrate 110 may be a semiconductor substrate, including silicon, germanium, silicon germanium, gallium arsenide (GaAs) or other appropriate semiconductor materials. Alternatively, the substrate 110 may include an epitaxial layer (not shown). Furthermore, the substrate 110 may be strained for performance enhancement. Alternatively, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or other appropriate methods. The substrate 110 may also include a fin structure of a fin-like field-effect transistor (FinFET) formed by suitable processes, such as lithography patterning process and etching process. In fact various embodiments may include any of a variety of substrate structures and materials.

The substrate 110 also includes various doped regions (not shown) formed by implantation techniques. For example, a portion of the substrate 110 is doped to form a P-type region and a P-well where an n-channel device will be fabricated. Similarly, another portion of the substrate 110 can be doped to form an N-type region and an N-well where a p-channel device will be fabricated. The doped regions are doped with P-type dopants, such as boron or $BF_2$, and/or N-type dopants, such as phosphorus or arsenic. The doped regions may be formed directly on the substrate 110, in a P-well structure, in an N-well structure, in a dual-well structure, or using a raised structure.

The substrate 110 also includes various isolation features, such as shallow trench isolation (STI) (not shown), formed in the substrate 110 to separate various devices. The formation of the STI may include etching a trench in the substrate 110, filling the trench by dielectric materials such as silicon oxide, silicon nitride, or silicon oxynitride and using chemical mechanical polishing (CMP) to remove the excessive dielectric metals layers.

In FIG. 1A, a dielectric material 120' is formed on the substrate 110 by any appropriate method, such as atomic layer deposition (ALD), chemical vapor deposition (CVD) and ozone oxidation. ALD is a gas phase chemical process and it is a self-limiting atomic layer-by-layer growth method. The surface-controlled growth mechanism of ALD provides good step coverage and dense films with few (or no) pinholes. The precision achieved with ALD allows processing of extremely thin films in a controlled way in the nanometer scale. The dielectric material 120' includes oxide, HfSiO and/or oxynitride. It has been observed that the dielectric material 120' may provide a remedy for some high-κ dielectric gate stack integration issues, such as threshold voltage pinning and reducing carrier mobility. The dielectric material 120' may also be a diffusion blocking to prevent undesirable interface reactions between the high-κ dielectric material and the substrate 110.

A gate material 210', such as polysilicon, is disposed on or above the dielectric material 120' by deposition techniques known in the art. Alternatively, an amorphous silicon layer may optionally be formed instead of the polysilicon layer. Additionally a patterned hard mask 300 is formed on the gate material 210'. The patterned hard mask 300 includes silicon nitride and/or silicon oxide, or alternatively photoresist. The patterned hard mask 300 may include multiple layers. The patterned hard mask 300 is patterned by a photolithography process and an etching process.

Figure 1B:
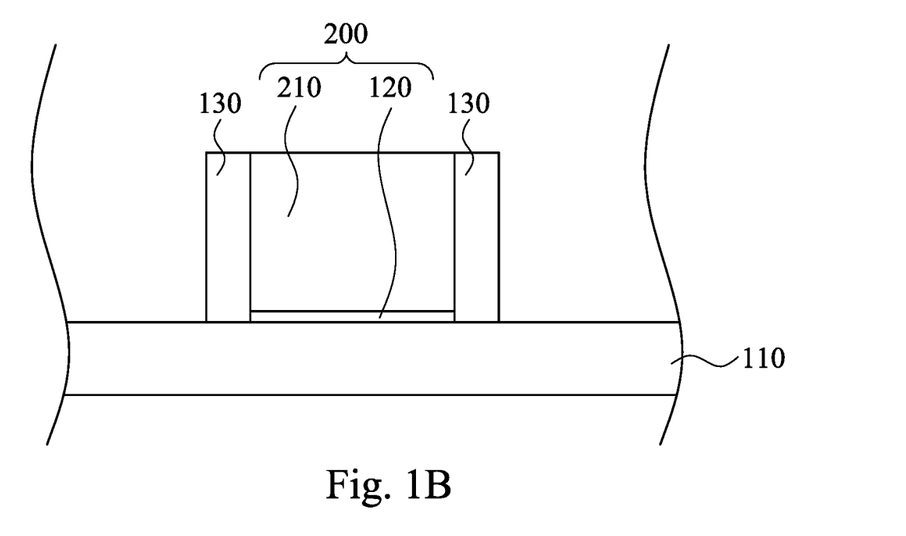

Reference is made to FIG. 1B. By using the patterned hard mask 300 of FIG. 1A as an etch mask, an etching process is applied to form a dummy gate stack 200. The dummy gate stack 200 includes a dummy gate 210 patterned from the gate material 210' (see FIG. 1A) and an interfacial layer (IL) 120 patterned from the dielectric material 120' (see FIG. 1A). The etching process includes a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etching process may include a multiple-step etching to gain etch selectivity, flexibility and desired etch profile.

After the dummy gate stack 200 is formed, sidewall spacers 130 are formed on the sidewalls of the dummy gate stack 200. The sidewall spacers 130 may include a dielectric material such as silicon oxide, silicon nitride, silicon carbide, silicon oxynitride, or combinations thereof. In some embodiments, the two sidewall spacers 130 are respectively formed by multiple layers or multiple spacers. For example, a seal spacer is formed on the sidewall of the dummy gate stack 200 first, then a main spacer is formed on the seal spacer. The sidewall spacers 130 may be formed by deposition and etch processes known in the art.

Figure 1C:
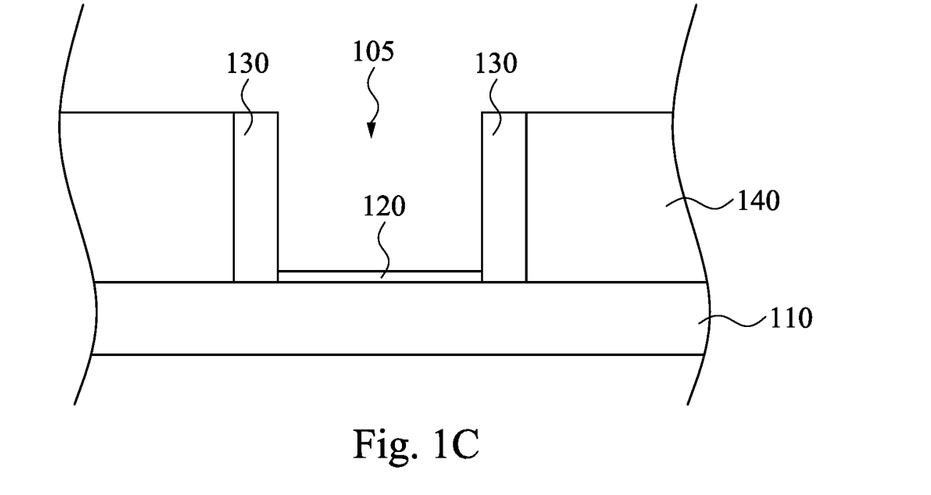

Reference is made to FIG. 1C. The dummy gate 210 of FIG. 1B is removed to form an opening 105. In some embodiments, before removing the dummy gate 210, a dielectric layer 140 is formed at outer sides of the sidewall spacers 130 on the substrate 110. The dielectric layer 140 includes silicon oxide, oxynitride or other suitable materials. The dielectric layer 140 includes a single layer or multiple layers. The dielectric layer 140 is formed by a suitable technique, such as CVD or ALD. A chemical mechanical planarization (CMP) process may be applied to remove excessive dielectric layer 140 and expose the top surface of the dummy gate 210 to a subsequent dummy gate removing process.

In the present disclosure, a replacement gate (RPG) process scheme is employed. Generally, in a RPG process scheme, a dummy polysilicon gate is formed first and is replaced later by a metal gate after high thermal budget processes are performed. In some embodiments, the dummy gate 210 (see FIG. 1B) is removed to form the opening 105 with the sidewall spacer 130 as its sidewall. In some other embodiments, the interfacial layer 120 is removed as well. Alternatively, in some embodiments, the dummy gate 210 is removed while the interfacial layer 120 retains. The dummy gate 210 (and the interfacial layer 120) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 1D:
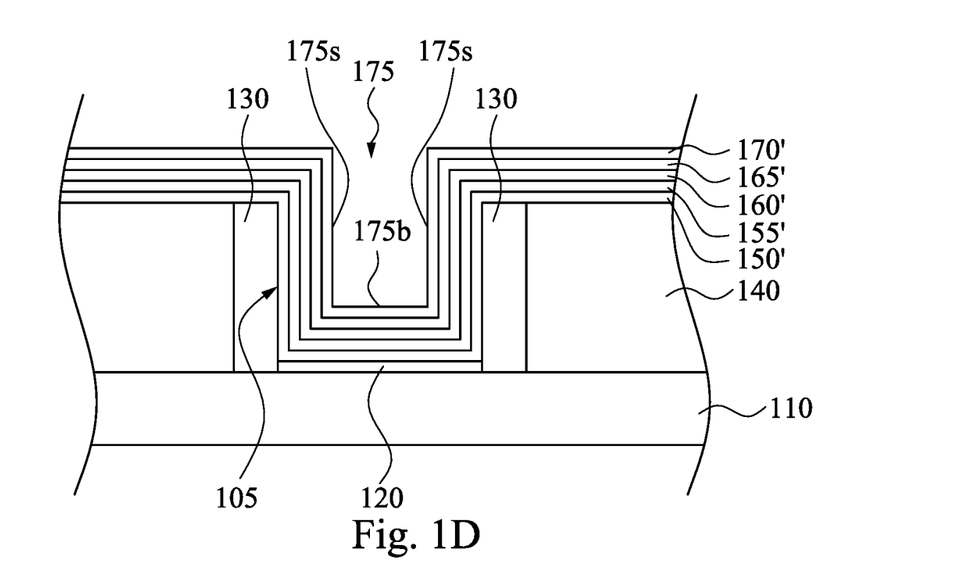

Reference is made to FIG. 1D. A high-κ dielectric layer 150' is conformally formed in the opening 105. In some embodiments, another interfacial layer is deposited first if the interfacial layer 120 of FIG. 1B is removed in a previous process step. The high-κ dielectric layer 150' may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-κ dielectric layer 150' is deposited by suitable techniques, such as ALD, CVD, physical vapor deposition (PVD), thermal oxidation, combinations thereof, or other suitable techniques. PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film.

Subsequently, a cap layer 155' is conformally formed on the high-κ dielectric layer 150'. The cap layer 155' is configured to conduct electricity and prevent inter-diffusion and reaction between high-κ dielectric layer 150' and a metal gate layer. The cap layer 155' may include refractory metals and their nitrides (e.g. TiN, TaN, $W_2N$, TiSiN, TaSiN). The cap layer 155' may be deposited by PVD, CVD, Metal-organic chemical vapor deposition (MOCVD) and ALD.

Then, a blocking layer 160' is conformally formed on the cap layer 155'. The blocking layer 160' may include metal nitride materials. For example, the blocking layer 160' includes TiN, TaN, or combination thereof. In some embodiments, the blocking layer 160' includes a single layer or multiple layers. For a multiple-layer configuration, the layers include different compositions of metal nitride from each other. For example, the blocking layer 160' has a first metal nitride layer including TiN and a second metal nitride layer including TaN. The blocking layer 160' is configured to inhibit diffusion of metal ions from a metal layer (i.e., a work function metal layer 165' herein) to adjacent layers, thereby inhibiting the formation of the undesirable voids in the vicinity of the work function metal layer 150' of the gate stack 200.

Subsequently, a work function metal layer 165' is conformally formed on the blocking layer 160'. In some embodiments, the work function metal layer 165' may include a single layer or multi layers, such as a work function film, a liner film, a wetting film, and an adhesion film. The work function metal layer 165' may include Ti, TiAl, TiAlN, TaC, TaCN, TaSiN, Mn, Zr, TiN, TaN, Ru, Mo, WN, Co, Al, or any suitable materials. For example, the work function metal layer 165' includes at least one of Ti, Al, or TiAl when a metal gate stack 250 (see FIG. 1G) is part of an N-channel MOS (NMOS) transistor of a complementary MOS (CMOS) device. Alternatively, the work function metal layer 165' includes at least one of TiN, Co, WN, or TaC when the metal gate stack 250 (see FIG. 1G) is part of a P-channel MOS (PMOS) transistor of the CMOS device. The work function metal layer 165' may be formed by ALD, PVD, CVD, or other suitable process.

Then, a blocking layer 170' is conformally formed on the work function metal layer 165'. The blocking layer 170' may include metal nitride materials. For example, the blocking layer 170' includes TiN, TaN, or combination thereof. In some embodiments, the blocking layer 170' includes a single layer or multiple layers. For a multiple-layer configuration, the layers include different compositions of metal nitride from each other. For example, the blocking layer 170' has a first metal nitride layer including TiN and a second metal nitride layer including TaN. The blocking layer 170' is configured to inhibit diffusion of metal ions from a metal layer (i.e., a gate electrode 190 in FIG. 1G) to adjacent layers, thereby inhibiting the formation of the undesirable voids in the vicinity of the gate electrode 190 of the metal gate stack 250. After the formation of the blocking layer 170', the size of the opening 105 is reduced to the opening 175. The opening 175 has a bottom surface 175b and two sidewalls 175s.

Figure 1E:
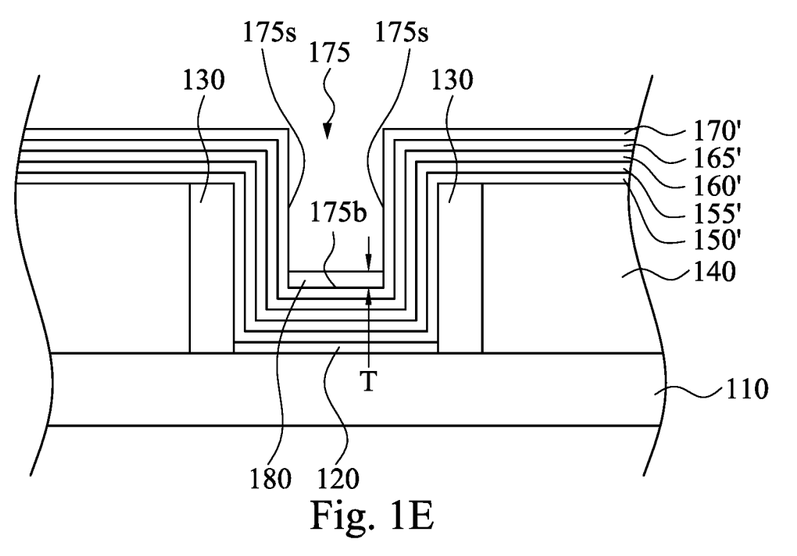

Reference is made to FIG. 1E. A metal adhesive 180 is anisotropically formed on the blocking layer 170' and in the opening 175, such that the metal adhesive 180 is disposed on the bottom surface 175b of the opening 175 while leaving at least a portion of the sidewall 175s of the opening 175 exposed. The anisotropic deposition method employed to deposit the metal adhesive 180 can be any method that provides a directional deposition so that more metal adhesive material is deposited on horizontal surfaces than on vertical surfaces. For example, the anisotropic deposition method can be a collimated physical vapor deposition (PVD) method, in which the first metallic material is directed downward in directions substantially parallel to the vertical direction of the exemplary semiconductor structure. Alternately, the anisotropic deposition method can employ radio frequency physical vapor deposition (RFPVD) sputtering and/or with constant voltage substrate bias, i.e., constant electrical voltage bias applied to the substrate. The deposition rate depends on the angle of incidence of incoming particles, resulting in a higher deposition rate on the bottom surface 175b than the sidewalls 175s of the opening 175. In some embodiments, the metal adhesive 180 is made of metal alloy. In some other embodiments, the metal adhesive 180 is made of silicon (Si), boron (B), tungsten silicon ($WSi_x$), tungsten boron ($WB_x$), tungsten boron silicon ($WSi_xB$), or any combination thereof.

Since the metal adhesive 180 is formed by using the anisotropically deposition process, the metal adhesive 180 is deposited on the bottom surface 175b of the opening 175 and substantially exposes the sidewalls 175s of the opening 175. In some embodiments, a thickness T of the metal adhesive 180 is about 1 angstrom to about 20 angstrom.

Figure 1F:
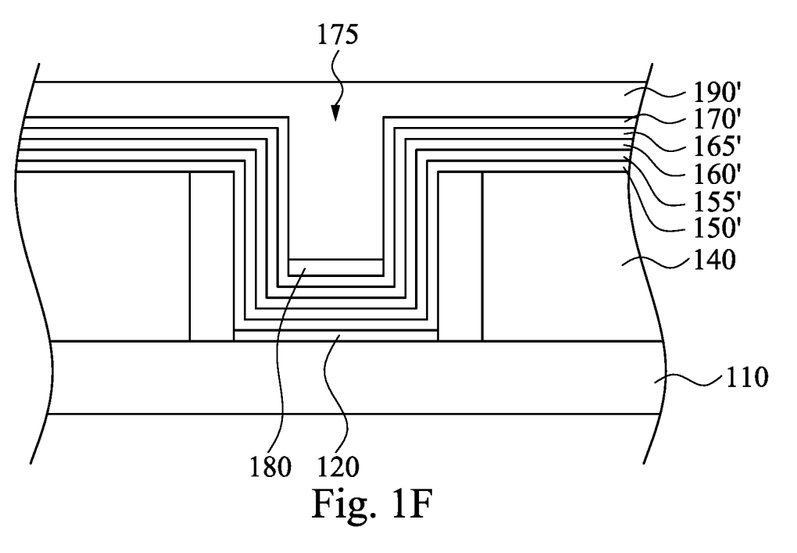

Reference is made to FIG. 1F. The remaining opening 175 is filled with a metal layer 190' on the metal adhesive 180. In some embodiments, the metal layer 190' includes tungsten (W). The metal layer 190' is deposited by ALD, PVD, CVD, or other suitable process. Since tungsten has a good adherence to silicon, boron, tungsten silicon, tungsten boron, tungsten boron silicon, or combination thereof, the tungsten can easily adhere to the metal adhesive 180. Therefore, the remaining opening 175 is filled in a bottom-up manner, without leaving a void, which may degrade device yield and cause reliability problems, such as delamination and electromigration during reliability testing. In some other embodiments, the metal layer 190' includes aluminum (Al), copper (Cu) or other suitable conductive material.

Figure 1G:
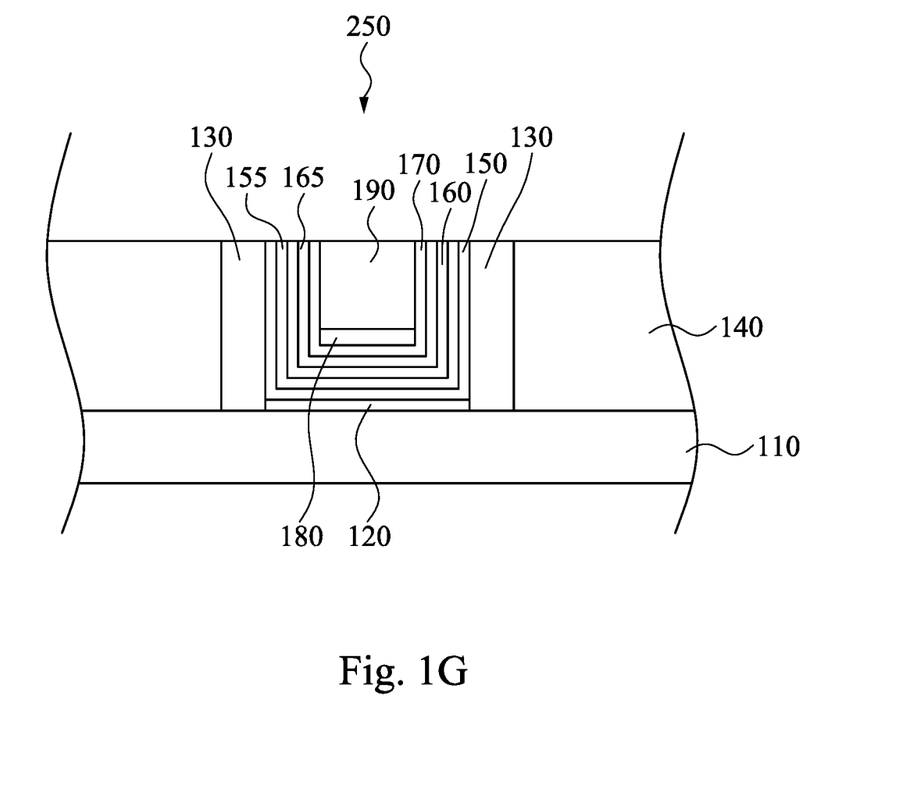

Reference is made to FIG. 1G. In some embodiments, a CMP process is applied to remove excessive the metal layer 190' (see FIG. 1F) to provide a substantially planar top surface for the metal layer 190', the blocking layers 170' and 160', the work function metal layer 165', the cap layer 155', and the high-κ dielectric layer 150' (see FIG. 1F). The remaining metal layer 190' is a gate electrode 190, the remaining blocking layers 170' and 160' are respectively blocking layers 170 and 160, the remaining work function metal layer 165' is a work function metal layer 165, the remaining cap layer 155' is a cap layer 155, and the remaining high-κ dielectric layer 150' is a high-κ dielectric layer 150. The gate electrode 190, the metal adhesive 180, the blocking layers 170 and 160, the work function metal layer 165, the cap layer 155, and the high-κ dielectric layer 150 together form the metal gate stack 250.

In FIGS. 1A-1G, before the metal layer 190' is formed, the metal adhesion 180 is formed above the bottom surface 175b of the opening 175, i.e., at the bottom of the opening 175 when the blocking layer 170 is formed. Since the metal adhesion layer 180 is anisotropically formed in the opening 175, the metal adhesion layer 180 is formed at the bottom of the opening 175. The metal adhesive 180 can adhere metal materials of the metal layer 190'. Hence, the metal layer 190' can be formed in a bottom-up manner. The metal adhesive 180 enables the metal layer 190' to have improved filling characteristics in the remaining opening 175, and therefore results in a continuous void-free metal gate stack 250 by facilitating filling of the remaining opening 175 with the metal such as tungsten thereof for forming the gate electrode 190 without leaving unfilled voids therein. The voids generated in a gate electrode may deteriorate an electrical characteristic and reliability of the gate electrode, increase the resistance of the gate electrode, and/or weaken the structural integrity of the gate electrode. Therefore, the configuration of FIG. 1G can improve the abovementioned problems. The metal adhesive 180 can be made of silicon (Si), boron (B), tungsten silicon ($WSi_x$), tungsten boron ($WB_x$), tungsten boron silicon ($WSi_xB$), or any combination thereof. In some embodiments, the thickness T of the metal adhesive 180 is about 1 angstrom to about 20 angstrom.

Figure 2A:
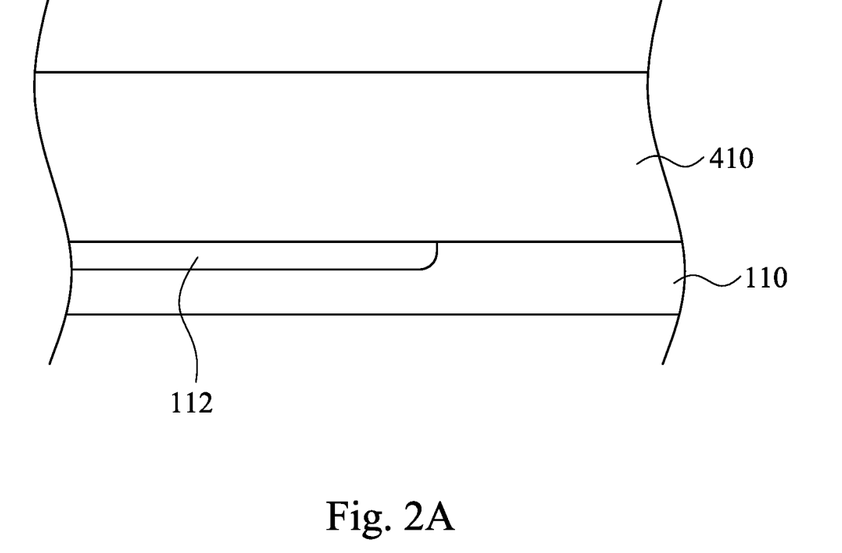
FIGS. 2A to 2D are cross-sectional views of a method for manufacturing a semiconductor device at various stages in accordance with some embodiments of the present disclosure.

The formation of void-free metal material in an opening can be applied to form a metal plug in a semiconductor device. FIGS. 2A to 2D are cross-sectional views of a method for manufacturing a semiconductor device at various stages in accordance with some embodiments of the present disclosure. Reference is made to FIG. 2A. A substrate 110 is provided. The substrate 110 may be a semiconductor substrate, including silicon, germanium, silicon germanium, gallium arsenide or other appropriate semiconductor materials. Alternatively, the substrate 110 may include an epitaxial layer (not shown). Furthermore, the substrate 110 may be strained for performance enhancement. Alternatively, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or other appropriate methods. The substrate 110 may also include a fin structure of a fin-like field-effect transistor (FinFET) formed by suitable processes, such as lithography patterning process and etching process. In fact various embodiments may include any of a variety of substrate structures and materials.

The substrate 110 also includes various doped regions formed by implantation techniques. For example, in FIG. 2A, a portion of the substrate 110 is doped to form a doped region 112. The doped region 112 can be a P-type region or an N-type region. In some embodiments, the doped region 112 can be doped with P-type dopants, such as boron or $BF_2$, and/or N-type dopants, such as phosphorus or arsenic. The doped region 112 may be formed directly on the substrate 110, in a P-well structure, in an N-well structure, in a dual-well structure, or using a raised structure.

The substrate 110 also includes various isolation features, such as shallow trench isolation (STI) (not shown), formed in the substrate 110 to separate various devices. The formation of the STI may include etching a trench in the substrate 110, filling the trench by dielectric materials such as silicon oxide, silicon nitride, or silicon oxynitride and using chemical mechanical polishing (CMP) to remove the excessive dielectric metals layers.

In FIG. 2A, a dielectric layer 410 is formed on the substrate 110. The dielectric layer 410 includes silicon oxide, oxynitride or other suitable materials. The dielectric layer 410 includes a single layer or multiple layers. The dielectric layer 410 is formed by a suitable technique, such as CVD or ALD.

Figure 2B:
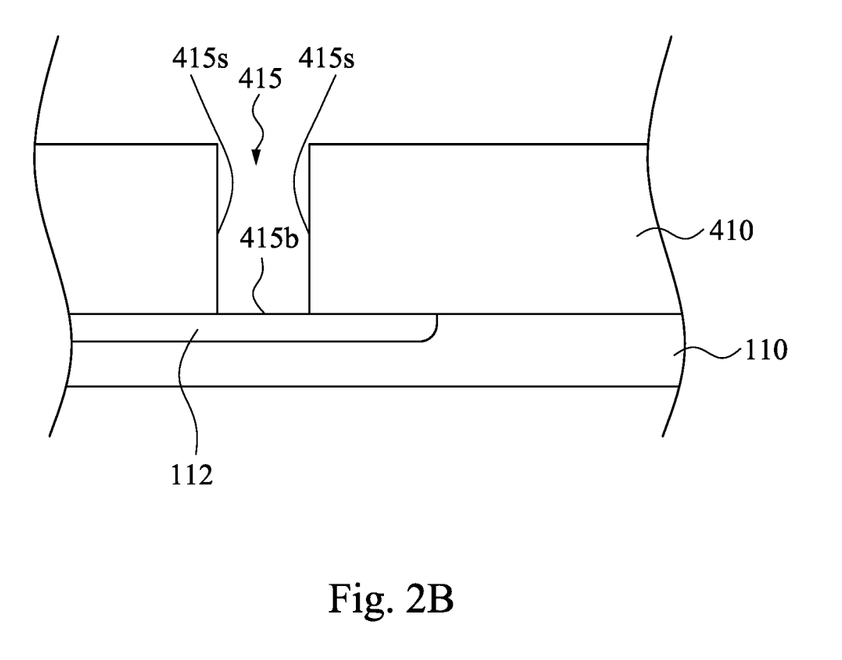

Reference is made to FIG. 2B. An opening 415 (or a via) is formed in the dielectric layer 410 to expose the doped region 112 of the substrate 110. In some embodiments, the opening 415 can be formed via use of standard photolithographic and RIE procedures, using $CHF_3$ as an etchant. In some other embodiments, appropriate etchants and techniques to provide high etch-rate-ratios are well known to those practicing this art. In FIG. 2B, the opening 415 has a bottom surface 415b and a sidewall 415s. In FIG. 2B, the bottom surface 415b is a top surface of the doped region 112 exposed by the opening 415.

Figure 2C:
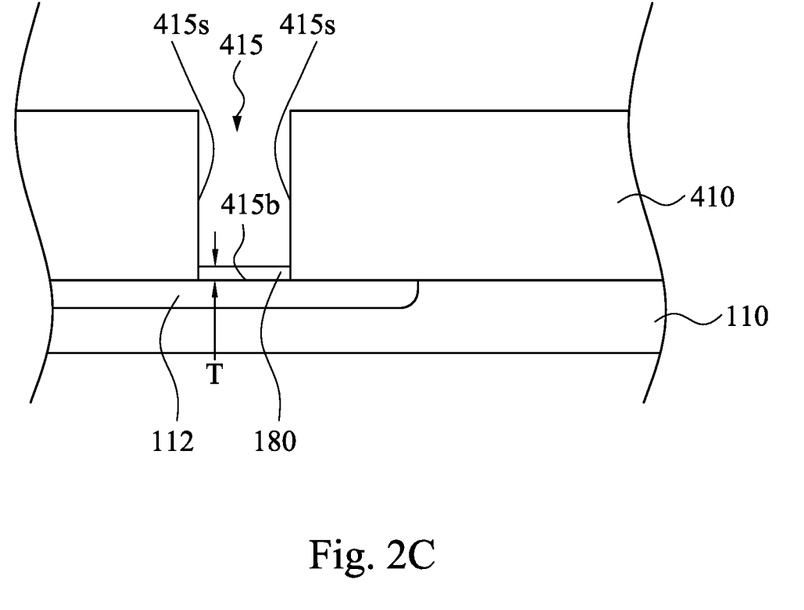

Reference is made to FIG. 2C. A metal adhesive 180 is anisotropically formed in the opening 415 and on the bottom surface 415b. The anisotropic deposition method employed to deposit the metal adhesive 180 can be any method that provides a directional deposition so that more metal adhesive material is deposited on horizontal surfaces than on vertical surfaces. For example, the anisotropic deposition method can be a collimated physical vapor deposition (PVD) method, in which the first metallic material is directed downward in directions substantially parallel to the vertical direction of the exemplary semiconductor structure. Alternately, the anisotropic deposition method can employ radio frequency physical vapor deposition (RFPVD) sputtering and/or with constant voltage substrate bias, i.e., constant electrical voltage bias applied to the substrate. The deposition rate depends on the angle of incidence of incoming particles, resulting in a higher deposition rate on the bottom surface 415b than the sidewall 415s of the opening 415. In some embodiments, the metal adhesive 180 is made of metal alloy. In some other embodiments, the metal adhesive 180 is made of silicon (Si), boron (B), tungsten silicon ($WSi_x$), tungsten boron ($WB_x$), tungsten boron silicon ($WSi_xB$), or any combination thereof.

Since the metal adhesive 180 is formed by using the anisotropically deposition process, the metal adhesive 180 is deposited on the bottom surface 415b of the opening 415 and substantially exposes the sidewall 415s of the opening 415. In some embodiments, a thickness T of the metal adhesive 180 is about 1 angstrom to about 20 angstrom.

Figure 2D:
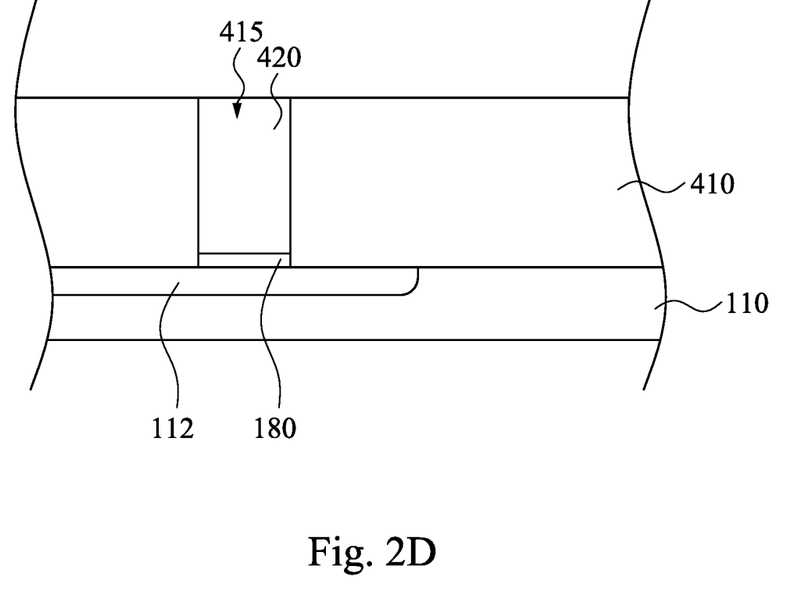

Reference is made to FIG. 2D. A metal plug 420 is formed in the remaining opening 415 and on the metal adhesive 180. In some embodiments, the metal plug 420 includes tungsten (W). For example, a metal layer is deposited to fill the opening 415 by ALD, PVD, CVD, or other suitable process. Then, the metal layer is patterned with photoresist and etched back to define the metal plug 420. Since tungsten has a good adherence to silicon, boron, tungsten silicon, tungsten boron, tungsten boron silicon, or combination thereof, the tungsten can easily adhere to the metal adhesive 180. Therefore, the remaining opening 415 is filled in a bottom-up manner, without leaving a void, which may degrade device yield and cause reliability problems, such as delamination and electromigration during reliability testing. In some other embodiments, the metal plug 420 includes aluminum (Al), copper (Cu) or other suitable conductive material.

In FIGS. 2A-2D, before the metal plug 420 is formed, the metal adhesive 180 is formed on the bottom surface 415b of the opening 415. Since the metal adhesive 180 is anisotropically formed in the opening 415, the metal adhesive 180 is formed at the bottom of the opening 415. The metal adhesive 180 can adhere metal materials of the metal plug 420. Hence, the metal plug 420 can be formed in a bottom-up manner. The metal adhesive 180 enables the metal plug 420 to have improved filling characteristics in the remaining opening 415, and therefore results in a continuous void-free metal plug 415 by facilitating filling of the remaining opening 415 with the metal such as tungsten thereof for forming the metal plug 420 without leaving unfilled voids therein. The metal adhesive 180 can be made of silicon (Si), boron (B), tungsten silicon ($WSi_x$), tungsten boron ($WB_x$), tungsten boron silicon ($WSi_xB$), or any combination thereof. In some embodiments, the thickness T of the metal adhesive 180 is about 1 angstrom to about 20 angstrom. In some other embodiments, the metal plug can be a plug formed in the interlayer dielectric (ILD).

According to some embodiments of the present disclosure, a method for manufacturing a semiconductor device includes etching a dummy gate to form an opening. A gate dielectric layer is deposited in the opening. A blocking layer is deposited over the gate dielectric layer, wherein the blocking layer has a bottom portion over a bottom of the opening and a sidewall portion over a sidewall of the opening. An adhesive layer is deposited over the bottom portion of the blocking layer. A metal layer is deposited over the adhesive layer, wherein the metal layer is in contact with the sidewall portion of the blocking layer.

According to some embodiments of the present disclosure, a method for manufacturing a semiconductor device includes etching a dummy gate to form an opening. A gate dielectric layer is deposited in the opening. An adhesive layer is deposited, using an anisotropic deposition process, over the gate dielectric layer, wherein the anisotropic deposition process has a first deposition rate over a bottom of the opening and a second deposition rate over a sidewall of the opening, and the first deposition rate is higher than the second deposition rate. A metal layer is deposited over the adhesive layer.

According to some embodiments of the present disclosure, a method for manufacturing a semiconductor device includes etching a dummy gate to form an opening. A gate dielectric layer is deposited in the opening. A first blocking layer is deposited over the gate dielectric layer, wherein the first blocking layer has a bottom portion over a bottom of the opening and a sidewall portion over a sidewall of the opening. An adhesive layer is deposited over the bottom portion of the first blocking layer, wherein the sidewall portion of the first blocking layer is at least partially free from coverage by the adhesive layer. A metal layer is deposited over the adhesive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

etching a dummy gate to form an opening, wherein the opening exposes an interfacial layer over an N-type region of a substrate;

depositing a gate dielectric layer in the opening such that the interfacial layer is between the substrate and the gate dielectric layer;

sequentially depositing a cap layer, a first blocking layer, and a work function layer over the gate dielectric layer and the N-type region;

depositing a second blocking layer over the work function layer, wherein the second blocking layer has a bottom portion over a bottom of the opening and a sidewall portion over a sidewall of the opening;

depositing an adhesive layer over the bottom portion of the second blocking layer; and depositing a metal layer over and in direct contact with the adhesive layer, wherein the metal layer is in direct contact with the sidewall portion of the second blocking layer.

2. The method of claim 1, wherein the metal layer is in contact with the adhesive layer.

3. The method of claim 1, wherein depositing the metal layer is performed such that the opening is filled with the metal layer in a substantially bottom-up manner.

4. The method of claim 1, wherein the adhesive layer comprises boron.

5. The method of claim 1, wherein the adhesive layer comprises silicon.

6. The method of claim 1, wherein depositing the adhesive layer is performed such that the sidewall portion of the second blocking layer is at least partially free from coverage by the adhesive layer.

7. The method of claim 1, wherein depositing the adhesive layer is performed using physical vapor deposition (PVD).

8. The method of claim 1, wherein the metal layer comprises tungsten.

9. The method of claim 1, wherein the second blocking layer is spaced apart from the gate dielectric layer.

10. The method of claim 1, wherein the first blocking layer is spaced apart from the gate dielectric layer.

11. A method, comprising:

etching a dummy gate to form an opening;

depositing a gate dielectric layer in the opening;

conformally depositing a work function metal layer over the gate dielectric layer;

depositing, using an anisotropic deposition process, an adhesive layer over the work function metal layer, wherein the anisotropic deposition process has a first deposition rate over a bottom of the opening and a second deposition rate over a sidewall of the opening, and the first deposition rate is higher than the second deposition rate, such that a topmost surface of the work function metal layer is higher than a topmost surface of the adhesive layer; and depositing a metal layer over the adhesive layer.

12. The method of claim 11, wherein the anisotropic deposition process comprises collimated physical vapor deposition (PVD), radio frequency physical vapor deposition (RFPVD), or combinations thereof.

13. The method of claim 11, wherein depositing the adhesive layer is performed such that a least a portion of the sidewall of the opening is free from coverage by the adhesive layer.

14. The method of claim 11, wherein depositing the metal layer is performed such that the metal layer tends to be deposited over the bottom of the opening rather than over the sidewall of the opening.

15. The method of claim 11, further comprising:

removing an excess portion of the metal layer external to the opening.

16. A method, comprising:

etching a dummy gate to form an opening surrounded by a dielectric layer;

depositing a gate dielectric layer in the opening;

depositing a cap layer over the gate dielectric layer;

depositing a first blocking layer over the cap layer;

depositing a work function metal layer over the first blocking layer;

depositing a second blocking layer over the work function metal layer, wherein the second blocking layer has a bottom portion over a bottom of the opening and a sidewall portion over a sidewall of the opening;

depositing an adhesive layer over the bottom portion of the second blocking layer, wherein the sidewall portion of the second blocking layer is at least partially free from coverage by the adhesive layer; and depositing, using a deposition process, a metal layer over the adhesive layer to form an N-channel transistor.

17. The method of claim 16, wherein depositing the metal layer is performed such that a sidewall of the metal layer is in contact with the sidewall portion of the second blocking layer.

18. The method of claim 16, wherein depositing the metal layer is performed such that a bottom surface of the metal layer is in contact with the adhesive layer.

19. The method of claim 16, wherein the second blocking layer comprises titanium nitride, tantalum nitride, or combinations thereof.

20. The method of claim 16, wherein the adhesive layer comprises tungsten.

* * * * *